(12) United States Patent
Scheuermann et al.

(10) Patent No.: US 8,476,771 B2
(45) Date of Patent: Jul. 2, 2013

(54) CONFIGURATION OF CONNECTIONS IN A 3D STACK OF INTEGRATED CIRCUITS

(75) Inventors: Michael R. Scheuermann, Katonah, NY (US); Joel A. Silberman, Somers, NY (US); Matthew R. Wordeman, Kula, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/217,789

(22) Filed: Aug. 25, 2011

(65) Prior Publication Data

US 2013/0049213 A1    Feb. 28, 2013

(51) Int. Cl.
| | |
|---|---|
| *H01L 23/52* | (2006.01) |
| *H01L 23/48* | (2006.01) |
| *H01L 29/40* | (2006.01) |
| *H01L 23/02* | (2006.01) |
| *H01L 23/538* | (2006.01) |

(52) U.S. Cl.
USPC ........... 257/774; 257/621; 257/777; 257/686; 257/E23.174

(58) Field of Classification Search
USPC ................... 257/774, 621, 777, 686, E23.174
See application file for complete search history.

(56) References Cited

U.S. PATENT DOCUMENTS

| | | | |
|---|---|---|---|
| 4,868,712 A | 9/1989 | Woodman | |
| 5,200,631 A | 4/1993 | Austin et al. | |
| 5,280,184 A | 1/1994 | Jokerst et al. | |
| 5,655,290 A | 8/1997 | Moresco et al. | |
| 5,702,984 A | 12/1997 | Bertin et al. | |
| 6,141,245 A | 10/2000 | Bertin et al. | |
| 6,258,623 B1 | 7/2001 | Moden et al. | |
| 6,569,762 B2 | 5/2003 | Kong | |
| 6,982,869 B2 | 1/2006 | Larson | |
| 7,021,520 B2 | 4/2006 | Bowen | |
| 7,030,486 B1 | 4/2006 | Marshall | |
| 7,067,910 B2 | 6/2006 | Drost et al. | |
| 7,111,149 B2 * | 9/2006 | Eilert ............................ 711/220 |

(Continued)

FOREIGN PATENT DOCUMENTS

FR    2946182 A1    12/2010

OTHER PUBLICATIONS

Badaroglu et al., "Clock-skew-optimization methodology for substrate-noise reduction with supply-current folding" ICCAD, vol. 25. No. 6, pp. 1146-1154, Jun. 2006.

(Continued)

*Primary Examiner* — Luan C Thai
(74) *Attorney, Agent, or Firm* — Tutunjian & Bitetto, P.C.; Louis J. Percello

(57) ABSTRACT

There is provided a connection configuration for a multiple layer chip stack having two or more strata. Each of the two or more strata has multiple circuit components, a front-side and a back-side. The connection configuration includes a connection pair having as members a front-side connection and a backside connection unconnected to the front-side connection. The front-side connection and the backside connection are co-located with respect to each other on a given stratum from among the two or more strata, and are respectively connected to different ones of the multiple circuit components on the given stratum. At least one of the front-side connection and the backside connection is also connected to a particular one of the multiple circuit components on an adjacent stratum to the given stratum from among the two or more strata.

25 Claims, 5 Drawing Sheets

U.S. PATENT DOCUMENTS

| | | | |
|---|---|---|---|
| 7,521,950 B2 | 4/2009 | Bernstein et al. | |
| 7,615,869 B2 | 11/2009 | Koo et al. | |
| 7,623,398 B2 | 11/2009 | Arai | |
| 7,701,251 B1 | 4/2010 | Rahman et al. | |
| 7,710,329 B2 | 5/2010 | Chiozzi | |
| 7,753,779 B2 | 7/2010 | Shayesteh | |
| 7,768,790 B2 | 8/2010 | Kuroda et al. | |
| 7,772,708 B2 | 8/2010 | Leddige et al. | |
| 7,830,692 B2 | 11/2010 | Chung et al. | |
| 7,863,960 B2 | 1/2011 | Wang et al. | |
| 2002/0089831 A1 | 7/2002 | Forthun | |
| 2004/0177237 A1 | 9/2004 | Huppenthal et al. | |
| 2005/0058128 A1 | 3/2005 | Carson et al. | |
| 2006/0043598 A1 | 3/2006 | Kirby et al. | |
| 2007/0033562 A1 | 2/2007 | Corraele et al. | |
| 2007/0047284 A1 | 3/2007 | Silvestri | |
| 2007/0132070 A1 | 6/2007 | V. Buot et al. | |
| 2007/0287224 A1 | 12/2007 | Alam et al. | |
| 2007/0290333 A1 | 12/2007 | Saini et al. | |
| 2008/0068039 A1 | 3/2008 | Bernstein et al. | |
| 2008/0204091 A1 | 8/2008 | Choo et al. | |
| 2009/0024789 A1 | 1/2009 | Rajan et al. | |
| 2009/0055789 A1 | 2/2009 | McIlrath | |
| 2009/0064058 A1 | 3/2009 | McIlrath | |
| 2009/0070549 A1 | 3/2009 | Solomon | |
| 2009/0070721 A1 | 3/2009 | Solomon | |
| 2009/0168860 A1 | 7/2009 | Magagni et al. | |
| 2009/0196312 A1 | 8/2009 | Kuroda | |
| 2009/0237970 A1 | 9/2009 | Chung | |
| 2009/0245445 A1 | 10/2009 | Saen et al. | |
| 2009/0323456 A1 | 12/2009 | Gomm | |
| 2010/0001379 A1 | 1/2010 | Lee et al. | |
| 2010/0005437 A1 | 1/2010 | McIlrath | |
| 2010/0044846 A1 | 2/2010 | Ohmi et al. | |
| 2010/0059869 A1 | 3/2010 | Kaskoun et al. | |
| 2010/0332193 A1 | 12/2010 | Hu et al. | |
| 2011/0016446 A1 | 1/2011 | Krebd | |
| 2011/0032130 A1 | 2/2011 | Ludwig | |
| 2011/0050320 A1* | 3/2011 | Gillingham | 327/365 |
| 2011/0121811 A1 | 5/2011 | Dennard et al. | |
| 2012/0038057 A1* | 2/2012 | Bartley et al. | 257/774 |

OTHER PUBLICATIONS

Chan et al., "A Resonant Global Clock Distribution for the Cell Broadband Engine Processor" IEEE J. Solid State Circuits, vol. 44, No. 1, pp. 64-72, Jan. 2009.

Gutnik et al., "Active GHz Clock Network Using Distributed PLLs" IEEE JSSC, vol. 35, No. 11, pp. 1553-1560, Nov. 2000.

Lam et al., "Power supply noise suppression via clock skew scheduling," in Proceedings of International Symposium on Quality Electronic Design, pp. 355-360, Mar. 2002.

Miura et al., "A 2.7Gb/s/mm2 0.9pj/b/Chip 1Coil/Channel ThruChip Interface with Coupled-Resonator-Based CDR for NAND Flash Memory Stacking," ISSCC, pp. 490-491, Feb. 2011.

Pavlidis et al., "Clock distribution networks for 3-D integrated Circuits", IEEE CICC, pp. 651-654, Sep. 2008.

Restle et al., "A Clock Distribution Method for Microprocessors", IEEE JSSC, vol. 36, No. 5, pp. 792-799, May 2001.

Tam et al., "Clock Generation and distribution for the first IA-64 Microprocessor", IEEE JSSC vol. 35, No. 11, pp. 1545-1552, Nov. 2000.

* cited by examiner

CONFIGURATION OF CONNECTIONS IN A 3D STACK OF INTEGRATED CIRCUITS

CROSS-REFERENCE TO RELATED APPLICATIONS

This application is related to the following commonly assigned applications, all concurrently filed herewith and incorporated herein by reference: Ser. No. 13/217,734, entitled "PROGRAMMING THE BEHAVIOR OF INDIVIDUAL CHIPS OR STRATA IN A 3D STACK OF INTEGRATED CIRCUITS"; Ser. No. 13/217,335, entitled "SYNCHRONIZING GLOBAL CLOCKS IN 3D STACKS OF INTEGRATED CIRCUITS BY SHORTING THE CLOCK NETWORK"; Ser. No. 13/217349, entitled "3D CHIP STACK SKEW REDUCTION WITH RESONANT CLOCK AND INDUCTIVE COUPLING"; Ser. No. 13/217,767, entitled "3D INTEGRATED CIRCUIT STACK-WIDE SYNCHRONIZATION CIRCUIT"; Ser. No. 13/217,381, entitled "3D INTER-STRATUM CONNECTIVITY ROBUSTNESS"; Ser. No. 13/217,406, entitled "AC SUPPLY NOISE REDUCTION IN A 3D STACK WITH VOLTAGE SENSING AND CLOCK SHIFTING"; and Ser. No. 13/217,429, entitled "VERTICAL POWER BUDGETING AND SHIFTING FOR 3D INTEGRATION".

BACKGROUND

1. Technical Field

The present invention relates generally to integrated circuits and, in particular, to the configuration of connections in a 3D stack of integrated circuits.

2. Description of the Related Art

Three-dimensional (3D) stacked chips include two or more electronic integrated circuit chips stacked one on top of the other. The chips are connected to each other with chip-to-chip interconnects that could use C4 or other technology, and the chips could include through-Silicon vias (TSVs) to connect from the one side of the chip to active electronics on the opposite side of the chip. The active electronics can be located on the front side or the back side.

SUMMARY

According to an aspect of the present principles, there is provided a connection configuration for a multiple layer chip stack having two or more strata. Each of the two or more strata has multiple circuit components, a front-side and a back-side. The connection configuration includes a connection pair having as members a front-side connection and a backside connection unconnected to the front-side connection. The front-side connection and the backside connection are co-located with respect to each other on a given stratum from among the two or more strata, and are respectively connected to different ones of the multiple circuit components on the given stratum. At least one of the front-side connection and the backside connection is also connected to a particular one of the multiple circuit components on an adjacent stratum to the given stratum from among the two or more strata.

According to another aspect of the present principles, there is provided a method for providing a connection configuration for a 3D chip stack having two or more strata. Each of the two or more strata has multiple circuit components, a front-side and a back-side. The method includes providing a connection pair having as members a front-side connection and a backside connection unconnected to the front-side connection and co-located with respect to each other on a given stratum from the two or more strata. The method further includes respectively connecting the front-side connection and the backside connection to different ones of the multiple circuit components on the given stratum. The method also includes connecting at least one of the front-side connection and the backside connection to a particular one of the multiple circuit components on an adjacent stratum to the given stratum from among the two or more strata.

According to yet another aspect of the present principles, there is provided a connection configuration for a 3D chip stack having two or more strata including a first terminal stratum on one end of the 3D chip stack and a second terminal stratum on an opposing end of the 3D chip stack. Each of the two or more strata has multiple circuit components, a front-side and a back-side. The first terminal stratum has the front-side being externally accessible. The connection configuration includes an array of backside connections on the two or more strata. The connection configuration includes an array of front-side connections on the two or more strata. Each of the front-side connections is co-located in relation to a respective one of the backside connections on a respective same one of the two or more strata. Each of the front-side connections, except last ones of the front-side connections on each of the two or more strata in a selected direction, is connected to a respective one of the backside connections that is adjacent to a co-located one of the backside connections on the respective same one of the two or more strata. Each of the last ones of the front-side connections is respectively connected to a given one of the multiple circuit components on the respective same one of the two or more strata. Each of the backside connections is connected to a co-located one of the front side connections on an adjacent one of the two or more strata. Each of the backside connections on the first terminal stratum is accessible to and from the at least some of the multiple circuit components on the first terminal stratum.

According to still another aspect of the present principles, there is provided a method for providing a connection configuration for a multiple layer chip stack having two or more strata including a first terminal stratum on one end of the 3D chip stack and a second terminal stratum on an opposing end of the 3D chip stack. Each of the two or more strata has multiple circuit components, a front-side and a back-side. The first terminal stratum has the front-side being externally accessible. The method includes providing an array of backside connections on the two or more strata. The method further includes providing an array of front-side connections on the two or more strata. Each of the front-side connections is co-located in relation to a respective one of the backside connections on a respective same one of the two or more strata. Each of the front-side connections, except last ones of the front-side connections on each of the two or more strata in a selected direction, is connected to a respective one of the backside connections that is adjacent to a co-located one of the backside connections on the respective same one of the two or more strata. Each of the last ones of the front-side connections is respectively connected to a given one of the multiple circuit components on the respective same one of the two or more strata. Each of the backside connections is connected to a co-located one of the front side connections on an adjacent one of the two or more strata. Each of the backside connections on the first terminal layer is accessible to and from the at least some of the multiple circuit components on the first terminal stratum.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to the configuration of connections in a 3D stack of integrated circuits. A stratum in a 3D stack may include connection points on its front-side and separately on its backside which "mate" with corresponding connection points on an adjacent stratum to provide inter-strata connection. Within any strata, the present principles provide approaches to arranging and wiring these front-side and backside connections points.

For illustrative purposes, three configurations of inter-strata interconnections are described herein which provide for a broad range of signal and power communication between strata in a 3D stack. These arrangements allow for a modular design and space savings. However, it is to be appreciated that given the teachings of the present principles provided herein, one of ordinary skill in this and related arts will contemplate these and various other configurations of inter-strata interconnections while maintaining the spirit of the present principles.

The first exemplary configuration approach involves a through-and-through connection, where the front-side and backside connection points are co-located in the same position in the front-side and backside planes of the strata. That is, the front-side and backside connection points are centered about a common line that is perpendicular to the plane of the strata. In this configuration, the front-side connection has an electrical connection to the backside connection. The front-side connection can also have an electrical connection to the circuitry on the strata. When stacked with other strata, the through-and-through connection provides a broadcast or pass-through function in the stack.

The second exemplary connection configuration involves a disjoint connection, where the front-side and backside connections are again coincident with a common line perpendicular to the plane of the strata. However, the front-side and backside connections are not directly connected to each other. Instead, each of the front-side and backside connections may be separately connected to separate elements of the circuitry on the strata.

The third exemplary connection configuration involves an inclined through-Silicon via (TSV) connection that includes an array of front-side and backside connection points, each front and backside centered on a line that is perpendicular to the plane of the strata, and each spaced a common distance from its neighbor. Within a stratum, each front-side connection is directly connected to the backside connection of its neighbor in a selected direction. The "last" connection point in the array is instead connected to an element in the circuit on the stratum. When a stack of similar connections is made, the array of connection points on the outer side of the terminal strata provides an extra-stack connection to individual strata when the number of connections in the array is at least as large as the number of strata in the stack.

Figure 1:
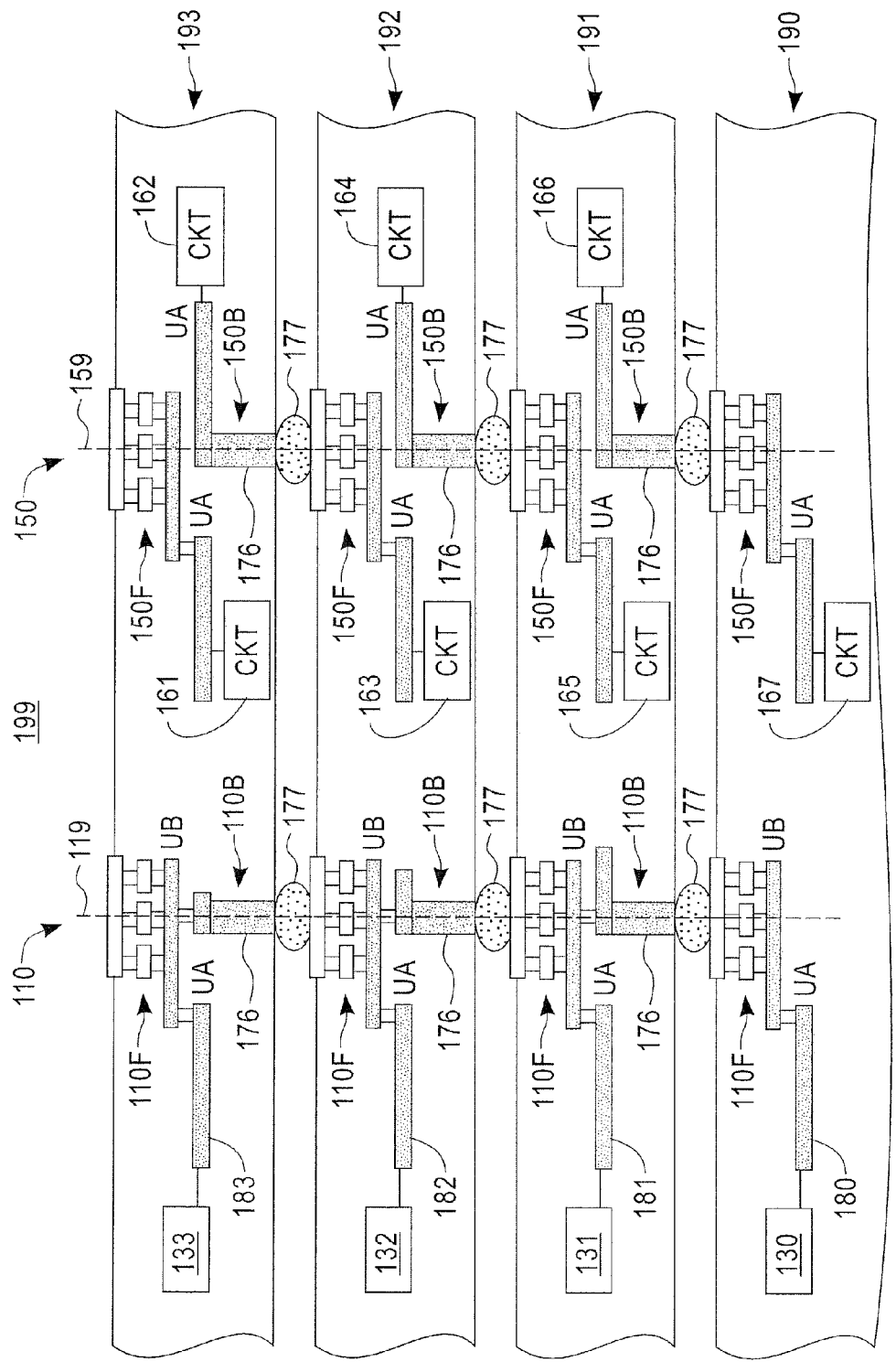
FIG. 1 shows exemplary through-and-through connections 110 and disjoint connections 150 for a 3D chip stack 199 that includes two or more strata, in accordance with an embodiment of the present principles.

FIG. 1 shows exemplary through-and-through connections 110 and disjoint connections 150 for a 3D chip stack 199 that includes two or more strata, in accordance with an embodiment of the present principles. In particular, FIG. 1 shows a schematic representation of the BEOL for the chip stack 199. UA and UB denote different wiring layers within a given stratum. We note that the intermediate wiring layers are not shown in FIG. 1. The chip stack 199 includes a stratum-0 190, a stratum-1 191, a stratum-2 192, and a stratum-3 193. The top of each stratum corresponds to the front-side of that stratum, and the bottom corresponds to the backside. The through-and-through connections 110 are depicted on the left side of FIG. 1, and the disjoint connections 150 are depicted on the right side of FIG. 1. The through-and-through connections 110 and the disjoint connections 150 can include and/or otherwise involve, for example, through-Silicon vias 176 and C4 connections 177 (including micro C4 (uC4) connections).

Regarding the through-and-through connections 110, each of the same includes (two) connection points on both the front-side and backside of a stratum. The (two) connection points are co-located in the plane of the stratum (chip or wafer surface), and are wired to the same net or same point in the stratum. That is, each through-and-through connection 110 includes a front-side connection 110F and a backside connection 110B that is co-located with respect to the front-side connection 110F. Stated yet another way, each through-and-through connection 100 includes a front-side connection 110F and a backside connection 110B that are both centered about a common line 119 that is perpendicular to the plane of the stratum on which they are located.

Hence, regarding stratum-3 193, both the front-side connection 110F and the backside connection 110B are connected to a common point 183 which, in turn, is connected to one or more of a variety of integrated circuit elements such as a circuit or a probe pad 133. Regarding stratum-2 192, both the front-side connection 110F and the backside connection 110B are connected to a common point 182 which, in turn, is connected to one or more of a variety of integrated circuit elements such as a circuit or a probe pad 132. Regarding stratum-1 191, both the front-side connection 110F and the backside connection 110B are connected to a common point 181 which, in turn, is connected to one or more of a variety of integrated circuit elements such as a circuit or a probe pad 131. Regarding stratum-0 190, the same may, but need not include a complete through-and through connection 110. Rather, a front-side connection 150F is sufficient and is simply connected to a point 180 which, in turn, is connected to one or more of a variety of integrated circuit elements such as a circuit or a probe pad 130.

Regarding the disjoint connections 150, each of the same includes (two) connection points on both the front-side and backside of a stratum. The (two) connection points are co-located in the plane of the stratum (chip or wafer surface), and are wired to different nets in the stratum. That is, each disjoint connection 150 includes a front-side connection 150F and a backside connection 150B that are both centered about a common line 159 that is perpendicular to the plane of the stratum on which they are located. However, the front-side connection 150F and the backside connection 150B are not directly connected to each other. Instead, each of the front-side connection 150F and the backside connection 150B can be separately connected to separate elements of the circuitry on the stratum.

Hence, regarding stratum-3 193, the front-side connection 150F is connected to a circuit 161, and the backside connection 150B is connected to a circuit 162. Regarding stratum-2 192, the front-side connection 150F is connected to a circuit 163, and the backside connection 150B is connected to a circuit 164. Regarding stratum-1 191, the front-side connection 150F is connected to a circuit 165, and the backside connection 150B is connected to a circuit 166. Regarding stratum-0 190, the same need not include a complete disjoint connection 150. Rather, a front-side connection 150F may be simply connected to a circuit 167.

Figure 2:
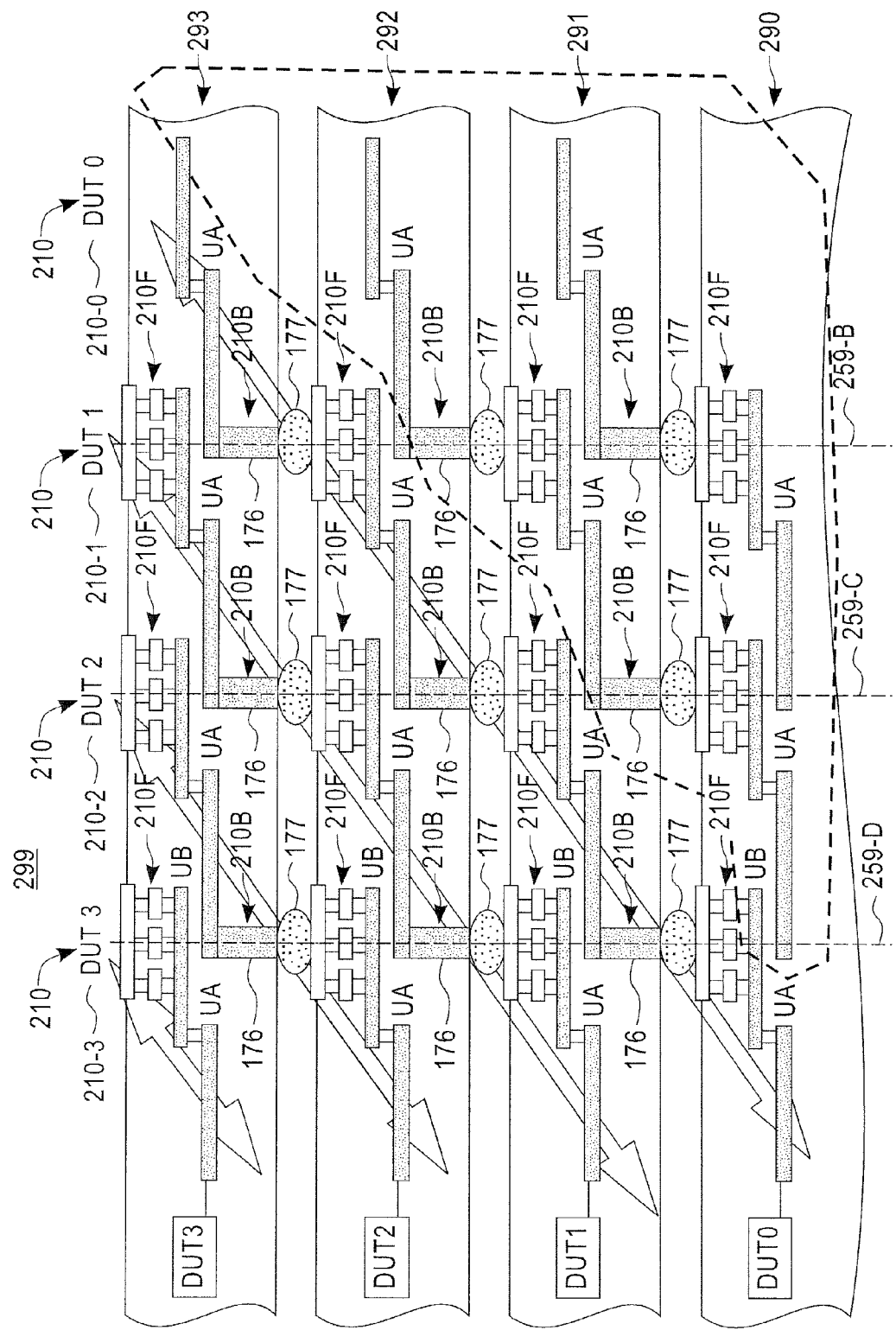
FIG. 2 shows exemplary inclined through-Silicon via (TSV) connections 210 for a 3D chip stack 299 that includes two or more strata, in accordance with an embodiment of the present principles.

FIG. 2 shows exemplary inclined through-Silicon via (TSV) connections 210 for a 3D chip stack 299 that includes two or more strata, in accordance with an embodiment of the present principles. In particular, FIG. 2 shows a schematic representation of the BEOL for the chip stack 299. UA and UB denote different wiring layers within a given stratum. We note that the intermediate wiring layers are not shown in FIG. 2. The chip stack 299 includes a stratum-0 290, a stratum-1 291, a stratum-2 292, and a stratum-3 293. The top of each stratum corresponds to the front-side of that stratum, and the bottom corresponds to the backside. The inclined TSV connections 210 can include and/or otherwise involve, for example, through-Silicon vias 176 and C4 connections 177 (including micro C4 (uC4) connections).

Each stratum has an array of connection points (hereinafter "front-side connections") 210F on the front-side and an array of connections (hereinafter "backside connections") 210B on the backside. The front-side connections 210F are co-located with respect to the backside connections 210B. Each of the backside connections 210B is wired to a connection point on the front-side that is adjacent to its co-located front-side connection 210F.

Stated another way, each stratum has an array of front-side connections 210F and an array of backside connections 210B. Each front-side connection 210F and backside connection 210B is centered on a respective line 259 (here, lines 259-B, 259-C, and 259-D for illustrative purposes) that is perpendicular to the plane of the stratum and is spaced a common distance from its neighbor (i.e., the adjacent front-side connection or adjacent backside connection, depending on which side). Within a stratum, each front-side connection 210F is directly connected to the backside connection 210B of its neighbor in a selected direction. The "last" connection point in the array is instead connected to an element in the circuit on the stratum on which the last connection point is located.

When the inclined TSV connections 210 are used in a 3D stack, an "inclined" bus is formed that allows a specific connection point from the outside of the stack to connect to an element on one specific stratum.

We note that the figure reference numeral 210 is used to generally represent inclined TSV connections in accordance with the present principles. However, to further distinguish between the different inclined TSV connections, the figure reference numeral 210 may include a suffix "-N", where N is an integer. Each of the strata includes at least a portion of a rightmost inclined TSV connection 210-0, a second rightmost inclined TSV connection 210-1, a third rightmost inclined TSV connection 210-2, and a fourth rightmost (i.e., the leftmost) inclined TSV connection 210-3.

Regarding stratum-3 293, the fourth rightmost inclined TSV connection 210-3 is connected to a device under test 3 (DUT3) probe. The fourth rightmost inclined TSV connection 210-3 begins and ends on stratum-3 293. Regarding stratum-2 292, the third rightmost inclined TSV connection 210-2 is connected to a device under test 2 (DUT2) probe. Regarding stratum-1 291, the second rightmost inclined TSV connection 210-1 is connected to a device under test 1 (DUT1) probe. Regarding stratum-0 290, the rightmost inclined TSV connection 210-1 is connected to a device under test 0 (DUT0) probe.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It is to be further appreciated that while one or more embodiments described herein may refer to the use of Silicon with respect to a chip or a through via, the present principles are not limited to using only chips or vias made from Silicon and, thus, chips or vias made from other materials including but not limited to Germanium and Gallium Arsenide may also be used in accordance with the present principles while maintaining the spirit of the present principles. Moreover, it is to be further appreciated that while one or more embodiments described herein may refer to the use of C4 or micro C4 (uC4) connections, the present principles are not limited to solely using C4 or micro C4 connections and, thus, other types of connections may also be used while maintaining the spirit of the present principles.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3:
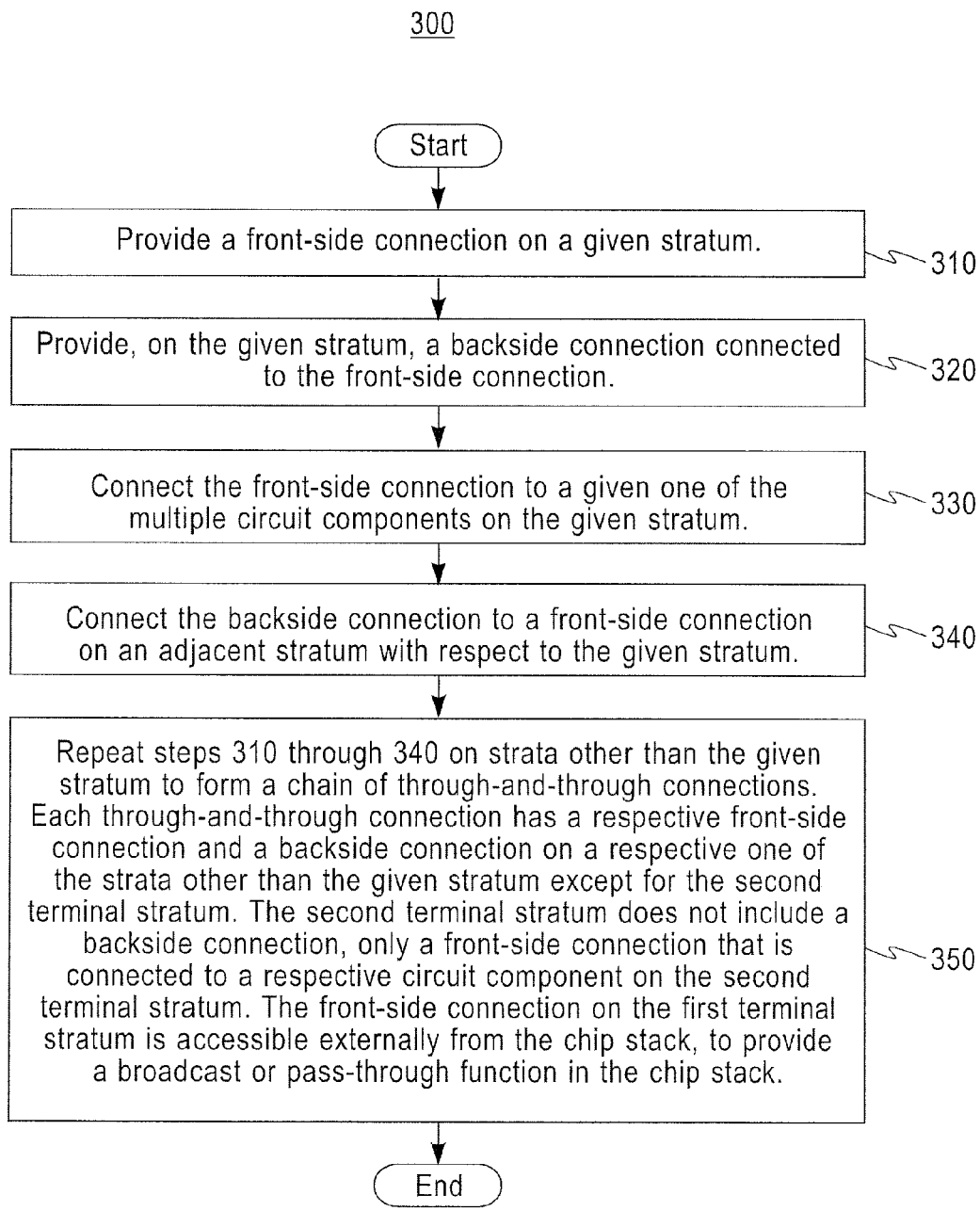
FIG. 3 shows a method 300 for providing through-and-through connections for a 3D chip stack having two or more strata, in accordance with an embodiment of the present principles.

FIG. 3 shows a method for providing through-and-through connections for a 3D chip stack having two or more strata, in accordance with an embodiment of the present principles. The two or more strata include a first terminal stratum and a second terminal stratum. Each of the two or more strata has multiple circuit components, a front-side and a back-side. The first terminal layer has an outward-facing front-side being externally accessible.

At step 310, a front-side connection is provided on a given stratum from among the two or more strata.

At step 320, a backside connection is provided on the given stratum and is connected to the front-side connection. The front-side connection and the backside connection are substantially centered about a line perpendicular to a plane of the given stratum.

At step 330, the front-side connection is connected to a given one of the multiple circuit components on the given stratum.

At step 340, the backside connection is connected to a front-side connection on an adjacent stratum with respect to the given stratum.

At step 350, steps 310 through 340 are repeated on strata other than the given stratum (which already includes a through-and-through connection as per steps 310-340) to form a chain of through-and-through connections, with each including a respective front-side connection and a backside connection on a respective one of the strata other than the given stratum except for the second terminal stratum which does not include a backside connection, only a front-side connection that is connected to a respective circuit component on the second terminal stratum. The front-side connection on the first terminal stratum is accessible externally from the chip stack, to provide a broadcast or pass-through function in the chip stack. It is to be appreciated that in other embodiments, the second terminal stratum may also include a backside connection corresponding to each front-side connection, but where such backside connection is left unconnected.

Figure 4:
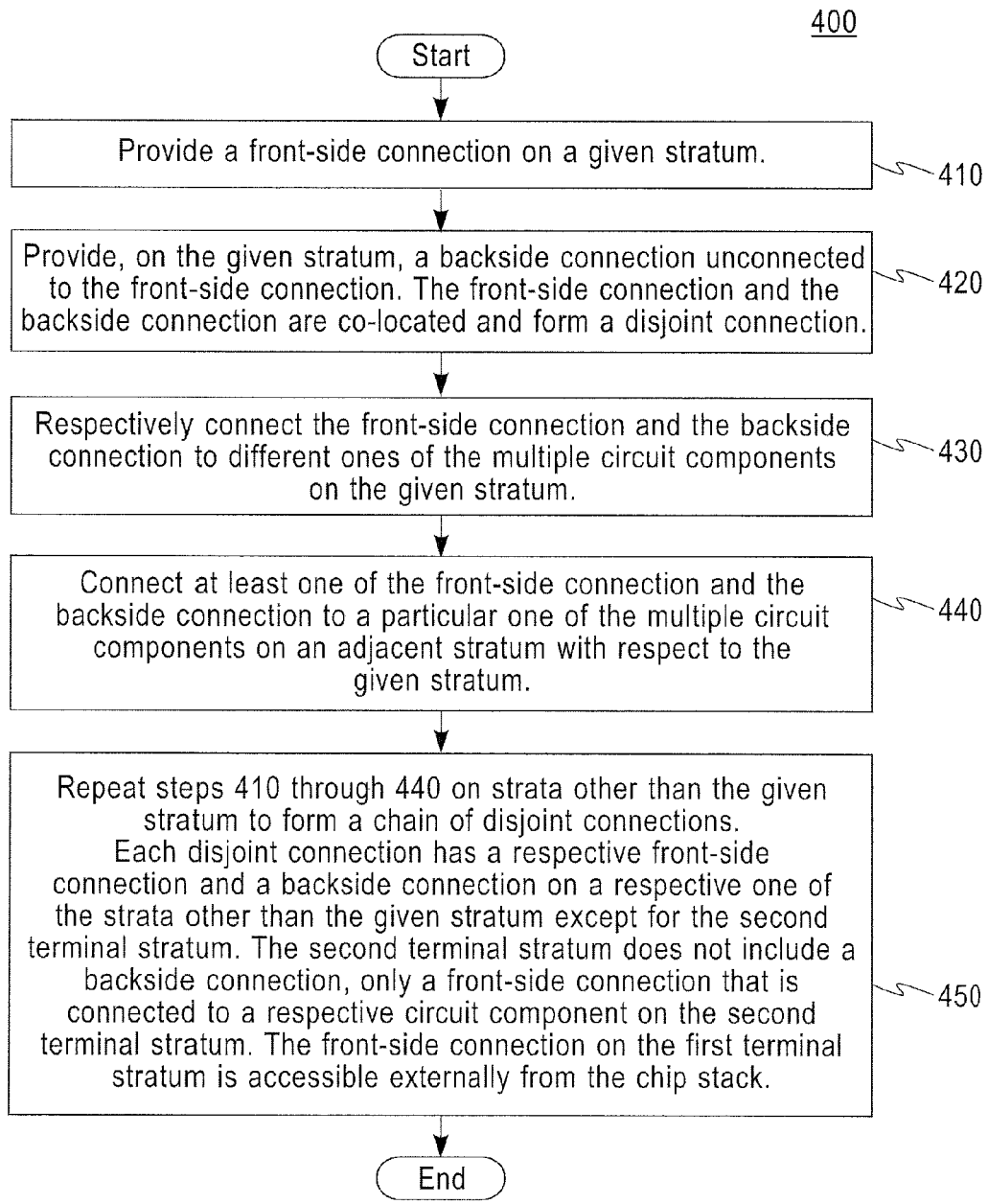
FIG. 4 shows a method 400 for providing disjoint connections for a 3D chip stack having two or more strata, in accordance with an embodiment of the present principles.

FIG. 4 shows a method for providing disjoint connections for a 3D chip stack having two or more strata, in accordance with an embodiment of the present principles. The two or more strata include a first terminal stratum and a second terminal stratum. Each of the two or more strata has multiple circuit components, a front-side and a back-side. The first terminal stratum has an outward-facing front-side being externally accessible.

At step 410, a front-side connection is provided on a given stratum from among the two or more strata.

At step 420, a backside connection is provided unconnected to the front-side connection and located on the given stratum. The front-side connection and the backside connection are co-located (substantially centered about a line perpendicular to a plane of the given stratum) and form a disjoint connection.

At step 430, the front-side connection and the backside connection are respectively connected to different ones of the multiple circuit components on the given stratum.

At step 440, at least one of the front-side connection and the backside connection is connected to a particular one of the multiple circuit components on an adjacent stratum with respect to the given stratum.

At step 450, steps 410 through 440 are repeated on strata other than the given stratum (which already includes a disjoint connection as per steps 410-440) to form a chain of disjoint connections, with each including a respective front-side connection and a backside connection on a respective one of the strata other than the given stratum except for the second terminal stratum which does not include a backside connection, only a front-side connection that is connected to a respective stack component on the second terminal stratum. The front-side connection on the first terminal stratum is accessible externally from the chip stack. It is to be appreciated that in other embodiments, the second terminal stratum may also include a backside connection corresponding to each front-side connection, but where such backside connection is left unconnected.

Figure 5:
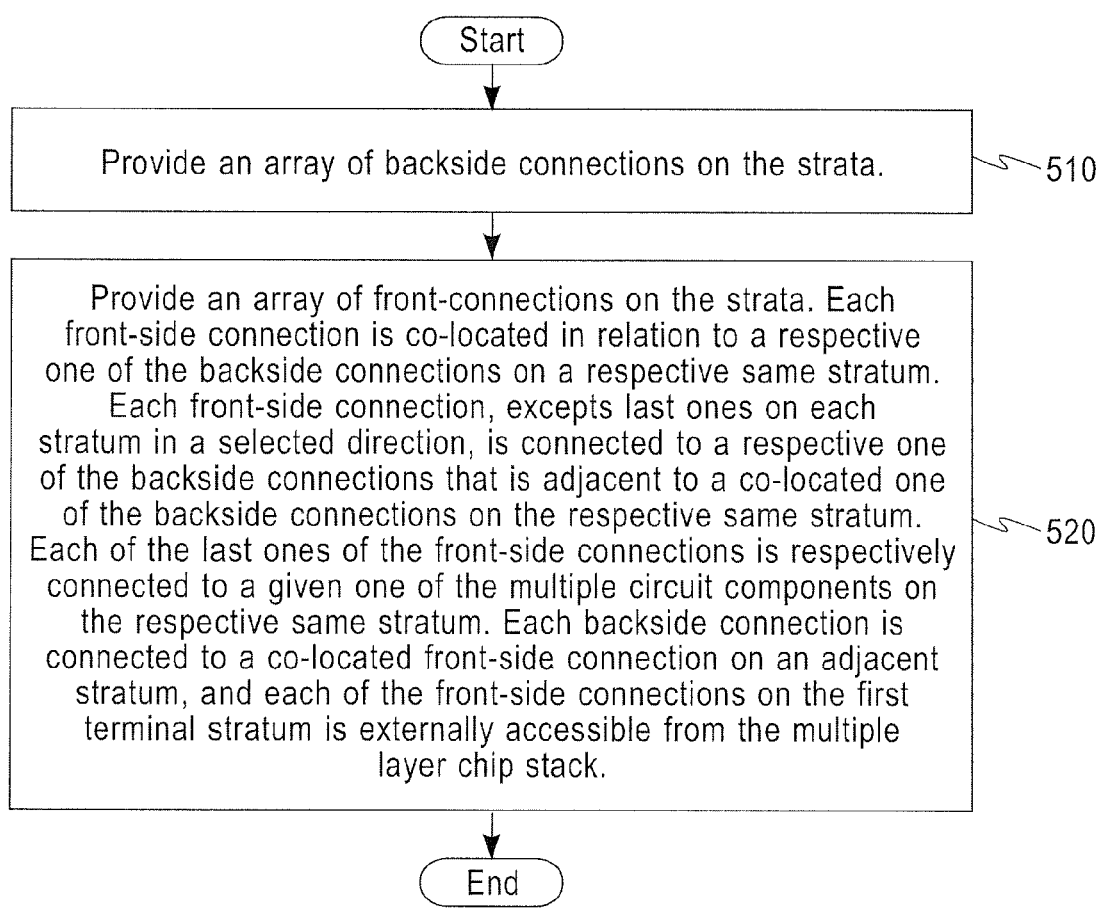
FIG. 5 shows a method 500 for providing inclined TSV connections for a 3D chip stack having two or more strata, in accordance with an embodiment of the present principles.

FIG. 5 shows a method for providing inclined TSV connections for a 3D chip stack having two or more strata, in accordance with an embodiment of the present principles. The two or more strata include a first terminal stratum and a second terminal stratum. Each of the two or more strata has multiple circuit components, a front-side and a back-side. The first terminal stratum has an outward-facing front-side being externally accessible.

At step 510, an array of backside connections is provided on the two or more strata.

At step 520, an array of front-side connections is provided on the two or more strata. Each of the front-side connections is co-located in relation to a respective one of the backside connections on a respective same one of the two or more strata. Each of the front-side connections, except last ones of the front-side connections on each of the two or more strata in a selected direction, is connected to a respective one of the backside connections that is adjacent to a co-located one of the backside connections on the respective same one of the two or more strata. Each of the last ones of the front-side connections is respectively connected to a given one of the multiple circuit components on the respective same one of the two or more strata. Each of the backside connections is connected to a co-located one of the front side connections on an adjacent one of the two or more strata, and each of the front-side connections on the first terminal stratum is externally accessible from the chip stack. It is to be appreciated that in other embodiments, the second terminal stratum may omit the backside connection corresponding to each front-side connection.

The present principles describe elements of a 3D integrated circuit. As such, it may be used in conjunction with other elements and circuits and wiring configurations specific to 3D integrated circuits.

The above described connection schemes can be realized with an IC technology that provides the following: (a) the standard IC elements such as a front-end-of-line (FEOL)

including circuit elements and a back-end-of-line (BEOL) with multiple wiring levels; (b) an enhancement to the technology that provides a through-Silicon via (TSV) that provides a low resistance electrical connection from one of the BEOL metal levels (other than the final level of metal located on the front-side of the wafer) and a connection point on the backside of the Silicon substrate; and (c) a means for stacking one chip or wafer (called a stratum here) on another such that when the connection points on one stratum line up with the adjacent connection points on the adjacent stratum, an electrical connection is made. Strata can be stacked front-to-front or front-to-back.

Some of the many attendant advantages of the present principles will now be described. The through-and-through TSV is the most compact arrangement for broadcast type signals and power. These would be used for power distribution or to stack inputs that would be common to all strata Disjoint vias allow for a compact way of receiving a signal on a stratum, processing it through some circuitry, and passing this on to another stratum for further processing. This is a common operation in many applications including scanning, bus operation and cross-strata muxing. If no disjoint via is available, one would need to use additional silicon area.

The inclined via is a special class of disjoint vias and allows for the following advantages. The inclined via provides hard-wired connections from stack C4s/pads to individual specific strata. Moreover, no strata specific BEOL or FEOL pattern customization is required. Further, the inclined via allows identical strata to be stacked while still providing strata specific extra stack connection points. Also, the inclined vias are generally usable for any strata specific connection (i.e., thermal diodes, CPI structures, voltage probes) as long as sufficient C4s/pads are available. Additionally, the inclined vias are believed to be easier to manage and cheaper than strata personalization using stratum specific BEOL patterns.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A connection configuration for a multiple layer chip stack having two or more strata, each of the two or more strata having multiple circuit components, a front-side and a backside, the connection configuration comprising:
   a connection pair having as members a front-side connection and a backside connection unconnected to the front-side connection;
   wherein the front-side connection and the backside connection are co-located with respect to each other on a given stratum from among the two or more strata, and are respectively connected to different ones of the multiple circuit components on the given stratum, and at least one of the front-side connection and the backside connection is also connected to a particular one of the multiple circuit components on an adjacent stratum to the given stratum from among the two or more strata.

2. The connection configuration of claim 1, wherein the at least one of the front-side connection and the backside connection is indirectly connected to the particular one of the multiple circuit components on the adjacent stratum through another backside connection or another front-side connection, respectively, on the adjacent stratum.

3. The connection configuration of claim 1, wherein the two or more strata include a first terminal stratum on one end of the 3D chip stack and a second terminal stratum on an opposing end of the 3D chip stack, the first terminal stratum having a front-side being externally accessible.

4. The connection configuration of claim 1, further comprising:
   a plurality of additional connection pairs, each having members thereof being unconnected to each other and co-located with respect to each other on a same respective one of the two or more strata other than the given stratum,
   wherein each of the members of the plurality of additional connection pairs comprise a respective one of a plurality of additional front-side connections and a respective one of a plurality of additional backside connections;
   wherein each respective one of the members of each of the plurality of additional connection pairs is connected to a respective different one of the multiple circuit components on the same respective one of the two or more strata on which the respective one of the members is located, and is also connected to another respective different one of the multiple circuit components on a neighboring stratum from among the two or more strata.

5. The connection configuration of claim 4, wherein each respective one of the members of each of the plurality of additional connection pairs is connected to the other respective different one of the multiple circuit components on the neighboring stratum indirectly through a different one of the additional front-side connections when the respective one of the members is one of the additional backside connections or through a different one of the additional backside connections when the respective one of the members is one of the additional front-side connections.

6. The connection configuration of claim 4, wherein the two or more strata include a first terminal stratum on one end of the 3D chip stack and a second terminal stratum on an opposing end of the 3D chip stack, the first terminal stratum having a front-side being externally accessible, and wherein the set of additional front-side connections includes one additional member compared to the set of additional backside connections, the one additional member being on the second terminal stratum and being connected to a given one of the multiple circuit components on the second terminal stratum.

7. The connection configuration of claim 1, wherein the at least one of the front-side connection and the backside connection comprises an electrical chip-to-chip connection.

8. The connection configuration of claim 7, wherein the electrical chip-to-chip connection comprises at least one C4 connection.

9. The connection configuration of claim 1, wherein at least one of the front-side connection and the backside connection comprises a through-Silicon via (TSV).

10. The connection configuration of claim 1, wherein the given stratum is a terminal stratum, the terminal layer being one of two outermost strata in the stack.

11. The connection configuration of claim 1, wherein the other one of the front-side connection and the backside connection is also connected to a given one of the multiple circuit components on a different adjacent layer from among the plurality of layers when the given stratum is not a terminal stratum.

12. The connection configuration of claim 1, wherein the at least one of the front-side connection and the backside connection is connected to the particular one of the multiple circuit components on the adjacent stratum indirectly using another backside connection or another front-side connection, respectively.

13. A method for providing a connection configuration for a 3D chip stack having two or more strata, each of the two or more strata having multiple circuit components, a front-side and a back-side, the method comprising:
providing a connection pair having as members a front-side connection and a backside connection unconnected to the front-side connection and co-located with respect to each other on a given stratum from the two or more strata;
respectively connecting the front-side connection and the backside connection to different ones of the multiple circuit components on the given stratum; and
connecting at least one of the front-side connection and the backside connection to a particular one of the multiple circuit components on an adjacent stratum to the given stratum from among the two or more strata.

14. The method of claim 13, wherein the at least one of the front-side connection and the backside connection is indirectly connected to the particular one of the multiple circuit components on the adjacent stratum through another backside connection or another front-side connection, respectively, on the adjacent stratum.

15. The method of claim 13, wherein the two or more strata include a first terminal stratum on one end of the 3D chip stack and a second terminal stratum on an opposing end of the 3D chip stack, the first terminal stratum having a front-side being externally accessible.

16. The method of claim 13, further comprising:
providing a plurality of additional connection pairs, each having members thereof being unconnected to each other and co-located with respect to each other on a same respective one of the two or more strata other than the given stratum,
wherein each of the members of the plurality of additional connection pairs comprise a respective one of a plurality of additional front-side connections and a respective one of a plurality of additional backside connections;
wherein each respective one of the members of each of the plurality of additional connection pairs is connected to a respective different one of the multiple circuit components on the same respective one of the two or more strata on which the respective one of the members is located, and is also connected to another respective different one of the multiple circuit components on a neighboring stratum from among the two or more strata.

17. The method of claim 13, wherein the at least one of the front-side connection and the backside connection comprises an electrical chip-to-chip connection.

18. The method of claim 17, wherein the electrical chip-to-chip connection comprises at least one micro C4 connection.

19. The method of claim 13, wherein at least one of the front-side connection and the backside connection comprises a through-Silicon via (TSV).

20. The method of claim 13, further comprising connecting the other one of the front-side connection and the backside connection to a given one of the multiple circuit components on a different adjacent stratum from among the two or more strata when the given stratum is not a terminal stratum.

21. A connection configuration for a 3D chip stack having two or more strata including a first terminal stratum on one end of the 3D chip stack and a second terminal stratum on an opposing end of the 3D chip stack, each of the two or more strata having multiple circuit components, a front-side and a back-side, the first terminal stratum having the front-side being externally accessible, the connection configuration comprising:
an array of backside connections on the two or more strata; and
an array of front-side connections on the two or more strata, each of the front-side connections being co-located in relation to a respective one of the backside connections on a respective same one of the two or more strata, each of the front-side connections, except last ones of the front-side connections on each of the two or more strata in a selected direction, being connected to a respective one of the backside connections that is adjacent to a co-located one of the backside connections on the respective same one of the two or more strata, each of the last ones of the front-side connections being respectively connected to a given one of the multiple circuit components on the respective same one of the two or more strata, and
wherein each of the backside connections is connected to a co-located one of the front side connections on an adjacent one of the two or more strata, and each of the backside connections on the first terminal stratum are accessible to and from the at least some of the multiple circuit components on the first terminal stratum.

22. The inclined connection configuration of claim 21, wherein each of the front-side connections on the first terminal stratum is externally accessible from the 3D chip stack.

23. The inclined connection configuration of claim 21, wherein each of the backside connections on each of the two or more strata is spaced a common distance apart.

24. The inclined connection configuration of claim 21, wherein each of the front-side connections on each of the two or more strata is spaced a common distance apart.

25. A method for providing a connection configuration for a multiple layer chip stack having two or more strata including a first terminal stratum on one end of the 3D chip stack and a second terminal stratum on an opposing end of the 3D chip stack, each of the two or more strata having multiple circuit components, a front-side and a back-side, the first terminal stratum having the front-side being externally accessible, the method comprising:
providing an array of backside connections on the two or more strata; and
providing an array of front-side connections on the two or more strata, each of the front-side connections being co-located in relation to a respective one of the backside connections on a respective same one of the two or more strata, each of the front-side connections, except last ones of the front-side connections on each of the two or more strata in a selected direction, being connected to a respective one of the backside connections that is adjacent to a co-located one of the backside connections on the respective same one of the two or more strata, each of the last ones of the front-side connections being respectively connected to a given one of the multiple circuit components on the respective same one of the two or more strata, and
wherein each of the backside connections is connected to a co-located one of the front side connections on an adjacent one of the two or more strata, and each of the backside connections on the first terminal layer are accessible to and from the at least some of the multiple circuit components on the first terminal stratum.

* * * * *